(12) United States Patent  
Marsh

(10) Patent No.: US 7,468,108 B2
(45) Date of Patent: *Dec. 23, 2008

(54) METAL LAYER FORMING METHODS AND CAPACITOR ELECTRODE FORMING METHODS

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 67 days.

This patent is subject to a terminal disclaimer.

(21) Appl. No.: 11/439,779

(22) Filed: May 23, 2006

(65) Prior Publication Data

US 2006/0207691 A1  Sep. 21, 2006

Related U.S. Application Data

(63) Continuation of application No. 10/133,951, filed on Apr. 25, 2002, now Pat. No. 7,105,065.

(51) Int. Cl.
*H01L 21/441* (2006.01)

(52) U.S. Cl. .............. 148/240; 148/273; 148/280; 438/387; 438/399; 438/650

(58) Field of Classification Search .............. 148/240, 148/273, 280; 438/387, 399, 650
See application file for complete search history.

(56) References Cited

U.S. PATENT DOCUMENTS

| | | |
|---|---|---|
| 5,187,637 A | 2/1993 | Embree |
| 5,444,013 A | 8/1995 | Akram et al. |
| 5,899,725 A | 5/1999 | Harshfield |
| 5,905,280 A | 5/1999 | Liu et al. |
| 5,908,947 A | 6/1999 | Vaartstra |
| 5,972,769 A | 10/1999 | Tsu et al. |
| 6,018,065 A | 1/2000 | Baum |
| 6,097,052 A | 8/2000 | Tanaka et al. |
| 6,204,049 B1 | 8/2000 | Solayappan |
| 6,162,712 A | 12/2000 | Baum |
| 6,180,447 B1 | 1/2001 | Park |
| 6,180,481 B1 | 1/2001 | DeBoer et al. |
| 6,204,172 B1 | 3/2001 | Marsh |
| 6,218,256 B1 | 4/2001 | Agarwal |

(Continued)

OTHER PUBLICATIONS

Suntola, "Surface Chemistry of Materials Deposition at Atomic Layer Level," Applied Surface Science, vol. 100/101, Mar. 1996, pp. 391-398.

(Continued)

*Primary Examiner*—George Wyszomierski
(74) *Attorney, Agent, or Firm*—Wells St. John P.S.

(57) ABSTRACT

A capacitor electrode forming method includes chemisorbing a layer of at least one metal precursor at least one monolayer thick on a substrate, the layer including non-metal components from the precursor. The chemisorbed layer can be treated with an oxidant and the non-metal components removed to form a treated layer of metal. A capacitor electrode can be formed including the treated layer and, optionally, additional treated layers. Preferably, treating the layer does not substantially oxidize the metal and the treated layers exhibit the property of inhibiting oxygen diffusion. The chemisorbing and the treating can be performed at a temperature below about 450° C. or preferably below about 350° C.

20 Claims, 4 Drawing Sheets

U.S. PATENT DOCUMENTS

| | | |
|---|---|---|
| 6,262,469 B1 | 7/2001 | Le et al. |
| 6,281,142 B1 | 8/2001 | Basceri et al. |
| 6,291,850 B1 | 9/2001 | Choi et al. |
| 6,363,691 B1 | 4/2002 | Flaherty |
| 6,420,230 B1 | 7/2002 | Derderian |
| 6,482,740 B2 | 11/2002 | Soininen et al. |
| 6,548,424 B2 | 4/2003 | Putkonen |
| 6,583,022 B1 | 6/2003 | Marsh |
| 6,632,279 B1 | 10/2003 | Ritala |
| 6,656,835 B2 | 12/2003 | Marsh |
| 6,730,163 B2 | 5/2004 | Vaartstra |
| 6,809,212 B2 | 10/2004 | Meiere et al. |
| 6,824,816 B2 | 11/2004 | Aaltonen et al. |
| 6,881,260 B2 | 4/2005 | Marsh et al. |
| 7,018,469 B2 | 3/2006 | Li et al. |
| 7,105,065 B2 * | 9/2006 | Marsh ................. 148/240 |
| 2001/0024387 A1 | 9/2001 | Raaijmakers et al. |
| 2001/0038116 A1 | 11/2001 | Figura et al. |
| 2002/0175329 A1 | 11/2002 | Hirano |

OTHER PUBLICATIONS

T. Suntola, Atomic Layer Epitaxy, Handbook of Crystal Growth, vol. 3, 1994, pp. 603-663.

Leskela and Ritala, ALD Precursor Chemistry: Evolution and Future Challenges, 1999.

Ritala et al., "Perfectly Conformal TiN and Al2O3 Films Deposited by Atomic Layer Deposition," Chemical Vapor Deposition, V. 5, No. 1, 1999, pp. 7-9.

U.S. Appl. No. 09/653,149, filed Aug. 2000, Derderian.

* cited by examiner

METAL LAYER FORMING METHODS AND CAPACITOR ELECTRODE FORMING METHODS

RELATED PATENT DATA

This application is a continuation of U.S. patent application Ser. No. 10/133,951, filed on Apr. 25, 2002, now U.S. Pat. No. 7,105,065 which is incorporated herein by reference.

TECHNICAL FIELD

The invention pertains to metal layer forming methods and capacitor electrode forming methods.

BACKGROUND OF THE INVENTION

Capacitors are common devices used in electronics, such as integrated circuits, and particularly semiconductor-based technologies. One common capacitor structure includes metal-insulator-metal (MIM) capacitors. A high K factor (also known as dielectric constant or "κ") dielectric material may be desirable to enhance capacitance. $Ta_2O_5$ is one example of a high K factor dielectric, but it inherently oxidizes other capacitor components when oxygen from the dielectric diffuses. The diffused oxygen can form undesired interfacial dielectrics that reduce an effective dielectric constant for the capacitor construction. The diffused oxygen can also oxidize a capacitor electrode and reduce its conductivity. Diffused oxygen might otherwise degrade performance of capacitor components. Use of other oxygen containing high K dielectric materials has proved to create similar problems.

SUMMARY OF THE INVENTION

According to one aspect of the invention, a capacitor electrode forming method includes chemisorbing a layer of at least one metal precursor at least one monolayer thick on a substrate, the layer including non-metal components from the precursor. The method includes treating the chemisorbed layer with an oxidant and removing the non-metal components to form a treated layer consisting essentially of metal. The chemisorbing, treating, and removing can be repeated sufficient to form at least one additional treated layer consisting essentially of metal on the treated layer. A capacitor electrode can be formed consisting of the treated layers. By way of example, the metal layers can exhibit the property of inhibiting oxygen diffusion to a greater extent than would another layer of same composition and thickness formed without the chemisorbing. Also, both the chemisorbing and the treating can be performed at a temperature below about 450° C. Further, treating the layer can be performed in a manner avoiding substantially oxidizing the metal.

In another aspect of the invention, a capacitor electrode forming method includes chemisorbing a layer of at least one metal precursor and treating the chemisorbed layer with an oxidant to form a treated layer consisting essentially of a metal. The metal can include iridium, osmium, or mixtures thereof. The chemisorbing and treating can be repeated to form a capacitor electrode comprising the treated layers.

According a further aspect of the invention, a metal layer forming method includes atomic layer depositing a layer on a substrate using precursor material including at least one of methylcyclopentadienyl platinum trimethyl $((CH_3C_5H_4)Pt(CH_3)_3)$ and cyclooctadienyl platinum dimethyl $((C_8H_{11})Pt(CH_3)_2)$, the layer including platinum and organic components from the precursor material. The method includes treating the layer with an oxidant and removing the organic components to form a treated layer consisting essentially of platinum. As an example, the treated layer can consist essentially of one saturated monolayer.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
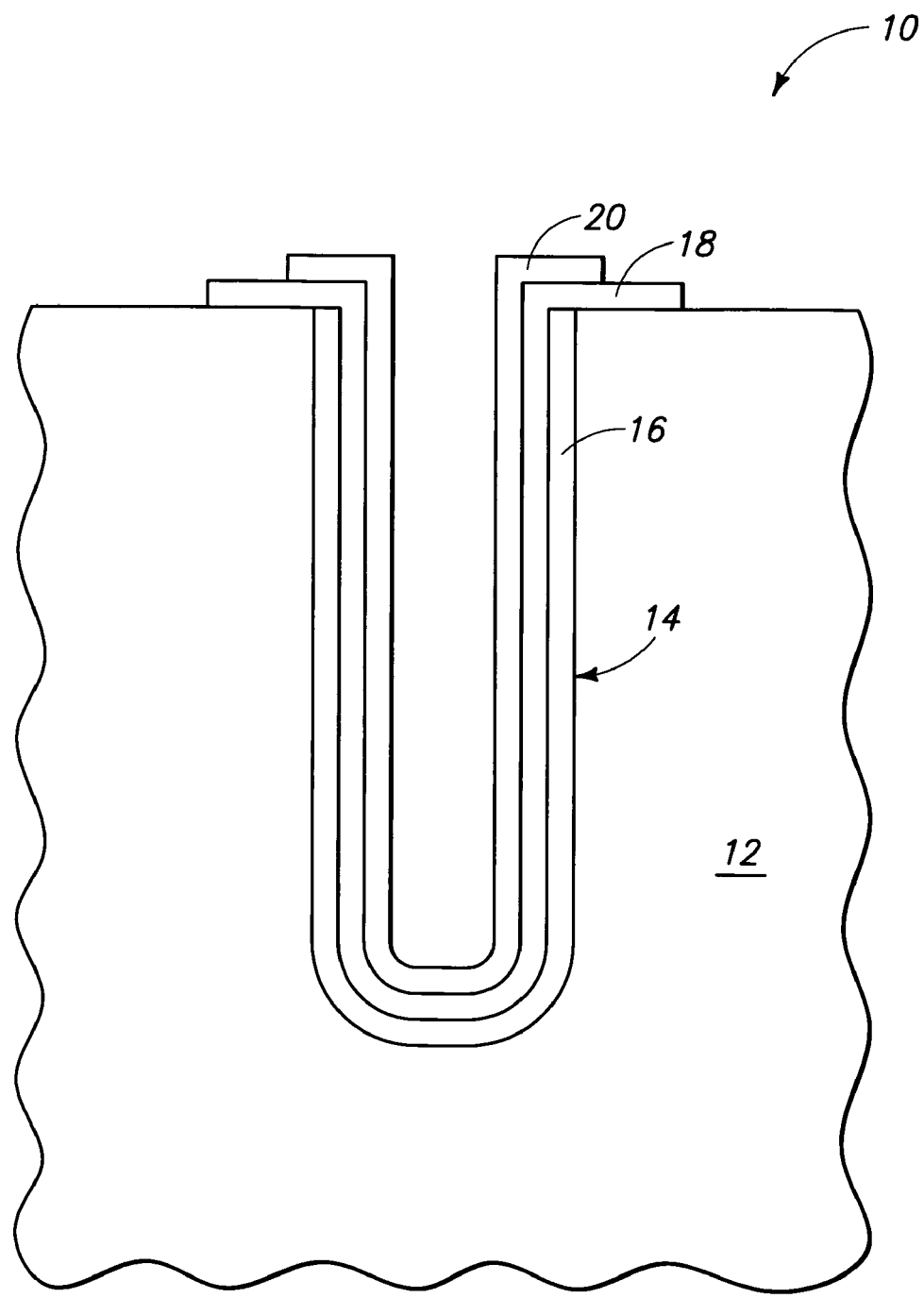
FIG. 1 shows a fragmentary, sectional view of a capacitor construction formed by a method according to one aspect of the invention.

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Also in the context of the present document, "metal" or "metal element" refers to the elements of Groups IA, IIA, and IB to VIIIB of the Periodic Table of the Elements along with the portions of Groups IIIA to VIA designated as metals in the periodic table, namely, Al, Ga, In, Tl, Ge, Sn, Pb, Sb, Bi, and Po. The Lanthanides and Actinides are included as part of Group IIIB. "Non-metals" refers to the remaining elements of the periodic table.

Described in summary, ALD includes exposing an initial substrate to a first chemical specie to accomplish chemisorption of the specie onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first specie is purged from over the substrate and a second chemical specie is provided to chemisorb onto the first monolayer of the first specie. The second specie is then purged and the steps are repeated with exposure of the second specie monolayer to the first specie. In some cases, the two monolayers may be of the same specie. Also, the second specie might not add a monolayer, but rather chemisorb onto and remove some portion of the first monolayer. Further, a third specie or more may be successively chemisorbed and purged just as described for the first and second species.

Purging may involve a variety of techniques including, but not limited to, contacting the substrate and/or monolayer with a carrier gas and/or lowering pressure to below the deposition pressure to reduce the concentration of a specie contacting the substrate and/or chemisorbed specie. Examples of carrier gases include $N_2$, Ar, He, etc. Purging may instead include contacting the substrate and/or monolayer with any substance that allows chemisorption byproducts to desorb and reduces the concentration of a contacting specie preparatory to introducing another specie. The contacting specie may be reduced to some suitable concentration or partial pressure known to those skilled in the art based on the specifications for the product of a particular deposition process.

ALD is often described as a self-limiting process, in that a finite number of sites exist on a substrate to which the first specie may form chemical bonds. The second specie might only bond to the first specie and thus may also be self-limiting. Once all of the finite number of sites on a substrate are bonded with a first specie, the first specie will often not bond to other of the first specie already bonded with the substrate. However, process conditions can be varied in ALD to promote such bonding and render ALD not self-limiting. Accordingly, ALD may also encompass a specie forming other than one monolayer at a time by stacking of a specie, forming a layer more than one atom or molecule thick. The various aspects of the present invention described herein are applicable to any circumstance where ALD may be desired. A few examples of materials that may be deposited by ALD include platinum, iridium, ruthenium, osmium, palladium, or mixtures thereof, titanium nitride, and others.

Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition specie that chemisorbs to a substrate or previously deposited specie. An ALD process regime may provide a simultaneously contacted plurality of species of a type or under conditions such that ALD chemisorption, rather than CVD reaction occurs. Instead of reacting together, the species may chemisorb to a substrate or previously deposited specie, providing a surface onto which subsequent species may next chemisorb to form a complete layer of desired material. Under most CVD conditions, deposition occurs largely independent of the composition or surface properties of an underlying substrate. By contrast, chemisorption rate in ALD might be influenced by the composition, crystalline structure, and other properties of a substrate or chemisorbed specie. Other process conditions, for example, pressure and temperature, may also influence chemisorption rate.

According to one aspect of the invention, a metal layer forming method includes chemisorbing a layer of at least one metal precursor at least one monolayer thick on a substrate. The at least one metal precursor can include a variety of metal elements, such as platinum, iridium, ruthenium, osmium, palladium, or mixtures thereof, as well as other metal elements. Since more than one metal precursor can be used, a variety of options exist for the precursors. For example, precursors could be selected containing different metals such that a resulting metal layer is a mixture, such as an alloy, of the different metals. Also, precursors could be selected containing the same metal, but containing different non-metal components of the precursor. A few examples of possible precursors include, but are not limited to, $MeCpPt(Me)_3$ (methylcyclopentadienyl platinum trimethyl $((CH_3C_5H_4)Pt(CH_3)_3)$), $CpPt(Me)_3$ (cyclopentadienyl platinum trimethyl $((C_5H_4)Pt(CH_3)_3)$), $(COD)Pt(Me)_2$ (cyclooctadienyl platinum dimethyl $((C_8H_{11})Pt(CH_3)_2)$), cis-$[PtMe_2(MeNC)_2]$, $Pt(acetylacetonate)_2$, $Pt(hexafluoroacetylacetonate)$, $Pt(PF_3)_4$, $Pt(CO)_2Cl_2$, etc.

In using a precursor, the chemisorbed layer can include non-metal components from the precursor. In the case of organometallic precursors, the non-metal component included in the chemisorbed layer can be an organic component. Similarly, in the case of inorganic metallic precursors, the non-metal components can be inorganic components. It is conceivable that the chemisorbed layer might include both organic and inorganic non-metal components from the precursor.

Accordingly, the method further includes treating the chemisorbed layer to form a treated layer consisting essentially of metal. One possible method of treating the chemisorbed layer includes contacting the layer with an oxidant and removing the non-metal components. Even so, treating the layer preferably does not substantially oxidize the metal. Depending on the metal and the non-metal component of a precursor, some portion of the chemisorbed metal layer might be oxidized during treatment. For example, platinum is considered resistant to oxidation. Thus, a treatment method can be selected that uses oxidants.

In particular, a wide variety of oxidants can be used in treatment of chemisorbed platinum precursor to form a treated layer consisting essentially of platinum with little concern for oxidizing the platinum. Preferred oxidants include $O_3$, $O_2$, $N_2O$, $H_2O_2$, $SO_3$, $H_2O$, etc. Understandably, a small amount of oxidation might occur and/or a small amount of non-metal component might remain yet the treated layer can still be considered not substantially oxidized and/or consist essentially of metal.

Criteria for determining a sufficient purity for the treated layer can be determined by those of ordinary skill taking into account the intended use and properties of a bulk metal layer that will include the treated layer. A statistically insignificant amount of oxidation or non-metal component might remain such that the treated layer consisting essentially of metal exhibits a statistically same conductivity compared to a treated layer consisting purely of metal. The type and amount of treatment and/or oxidant might warrant careful selection for other metal elements more susceptible to oxidation in comparison to platinum.

Essentially, treatment of the chemisorbed layer can be focused on breaking chemical bonds between non-metal components and the chemisorbed metal and, possibly, chemical bonds between non-metal components and the substrate. Example process conditions are described herein for a particular precursor and substrate. However, those of ordinary skill can determine appropriate process conditions for other precursors and substrates using chemical and physical property data currently available for such materials.

Purging is one additional process condition of note. As described above, ALD often uses purging (including evacuation) criteria that substantially prevent mixing of a precursor and an oxidant. Accordingly, a metal forming method can further include purging excess precursor from over the substrate prior to treating the chemisorbed layer with an oxidant. Also, the method can include purging the oxidant from over the substrate prior to chemisorbing any additional layers.

A further process condition of note is the chemisorption temperature and the treating temperature. Such temperatures can be different, but preferably they are both below 450° C. More preferably, both the chemisorbing and the treating are performed at a temperature below about 350° C. Still lower temperatures are also conceivable, such as about 100° C. Notably, oxidant strength can be one factor in providing a low treating temperature. For example, $O_3$ is a stronger oxidant than $O_2$ and can allow a lower treating temperature.

One advantage of the described low temperatures includes preventing spontaneous degradation of precursors. Precursors can be sensitive to temperature during chemisorbing and/or treating such that they degrade prior to chemisorption, possibly preventing true chemisorption, and instead only physically deposit on the substrate. Such physical deposition can result in forming defective monolayers such that film step coverage and/or desired properties are impacted. Degradation of chemisorbed precursors during or before treatment might yield by-products that are not removed as effectively by the treatment in comparison to chemisorbed precursors that have not degraded. Holding to the temperature guidelines described herein can assist in preventing precursor degradation and insuring efficient chemisorption and treatment.

A metal layer forming method may be used to form a treated layer consisting essentially of one saturated monolayer. The metal layer may also be more than one monolayer thick. Accordingly, the method can include sufficiently repeating the chemisorbing, the treating, and the removing to form at least one additional treated layer consisting essentially of metal on the treated layer. Successive treated layers can be provided to a desired thickness depending on a particular application.

The metal layer described herein can be suitable for use as a capacitor electrode. The small physical dimensions of some capacitors create demanding specifications for step coverage in forming the capacitor electrodes. The various aspects of a metal layer forming method described herein can be used to provide superior step coverage in a capacitor. In addition, observation indicates that the metal layers formed by the described methods can exhibit the property of inhibiting oxygen diffusion to a greater extent than would another layer of same composition and thickness formed without the chemisorbing or without atomic layer depositing.

As an inhibitor of oxygen diffusion, a metal layer can be incorporated into a capacitor in a variety of ways, including as an entire electrode or as part of an electrode with other parts formed by different methods. According to one aspect of the invention, a capacitor electrode forming method can be used to form treated layers consisting essentially of metal and forming a capacitor electrode consisting of the treated layers. In this manner, the entire capacitor electrode helps inhibit oxygen diffusion. Such a capacitor electrode may be particularly suitable as a bottom electrode of a capacitor that often has a smaller thickness as compared to a top electrode.

FIG. 1 shows a capacitor construction 10 that includes a substrate 12 having a capacitor opening 14 formed therein. A bottom electrode 16 is formed within capacitor opening 14 and on substrate 12. A dielectric layer 18 is formed on bottom electrode 16 and a top electrode 20 is formed on dielectric layer 18. Notably, the structures shown in FIG. 1 can be supplemented with additional capacitor structures according to the knowledge of those skilled in the art. Also, the structures shown as single layers can be multiple layer structures.

Substrate 12 can include at least one of insulative and semiconductive material. Capacitor opening 14 can be formed within insulative material and a conductive connection provided to a semiconductive diffusion region (not shown). Also, capacitor opening 14 can be formed through insulative material and into an underlying semiconductive material having a diffusion region. Further, substrate 12 can be a semiconductive material of which all or a portion comprises a diffusion region.

Thus, chemisorbing a layer of at least one metal precursor at least one monolayer thick can occur on insulative material, such as within a capacitor opening to form a bottom electrode. As an alternative, a conductive layer can be formed as part of a capacitor electrode and additional metal formed thereon by a method according to the various aspects of the invention. Titanium nitride is one example of a conductive layer. In such manner, the substrate on which chemisorbing occurs can be a conductive layer that is included in a capacitor electrode. In a still further alternative, treated layers consisting essentially of metal can be first formed and additional metal formed thereon by a method other than ALD. The combination of methods might be useful in forming a top electrode which often has a greater thickness compared to a bottom electrode.

With reference to FIG. 1, a method according to one aspect of the invention can include chemisorbing a layer of at least one metal precursor at least one monolayer thick on dielectric layer 18, treating the chemisorbed layer to form a treated layer consisting essentially of metal, and forming additional metal on the treated layer by some other method. It is conceivable that the treated layer so formed can exhibit the property of inhibiting oxygen diffusion. In light of the above options for forming an electrode, oxygen diffusion from dielectric layer 18 and other sources can be reduced with a capacitor electrode formed according to one of the various aspects of the invention.

Figure 2:
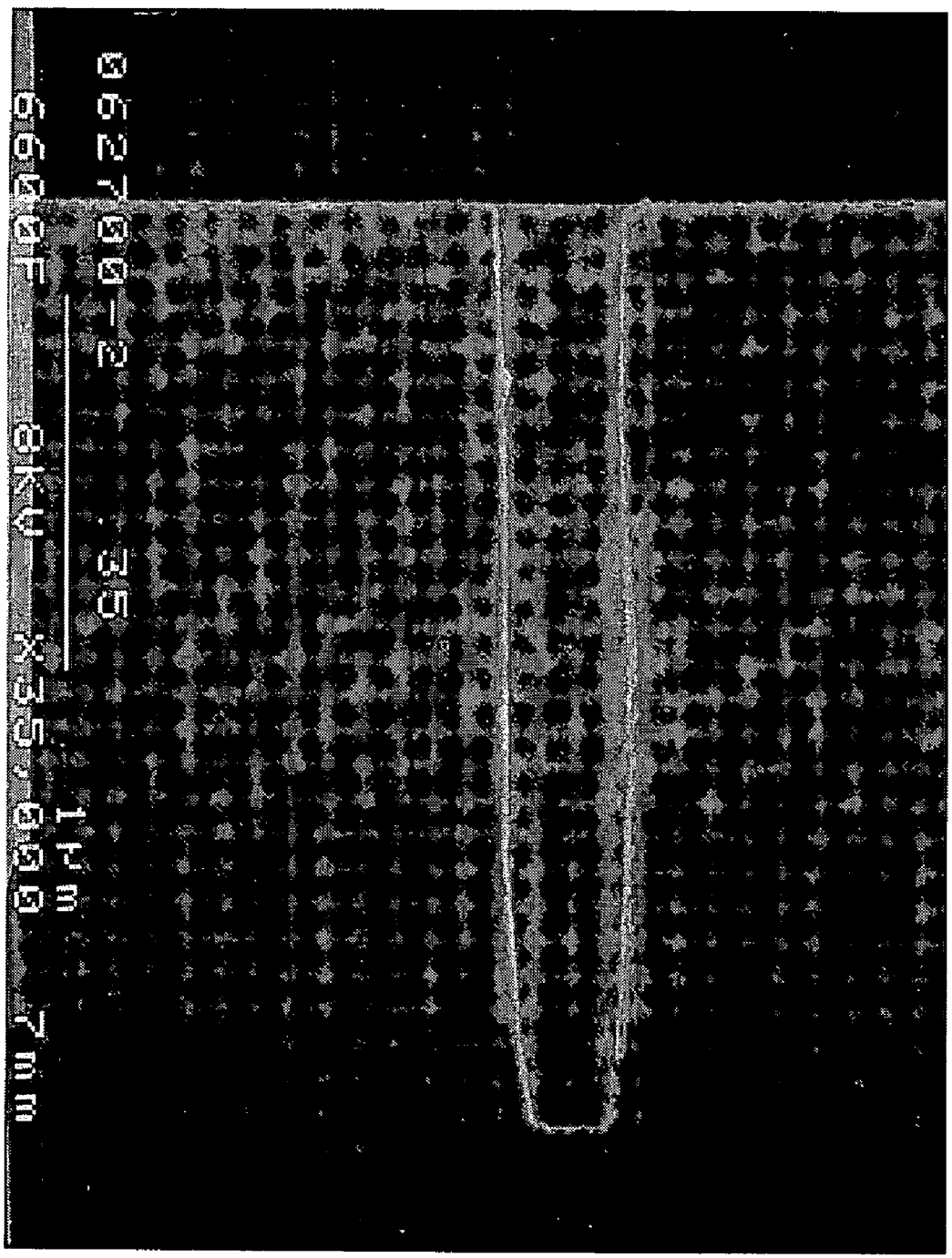
FIG. 2 shows a scanning electron microscope micrograph of platinum formed within an opening by a method according to one aspect of the invention.
Figure 3:
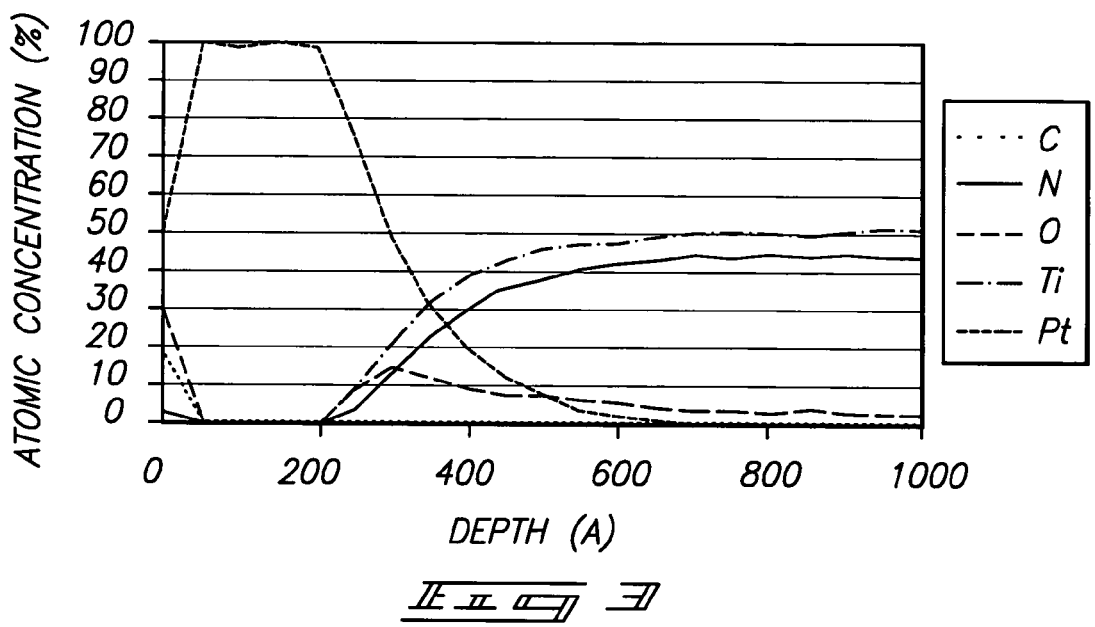
FIG. 3 shows an atomic concentration depth profile of a platinum layer formed on a titanium nitride layer by a method according to one aspect of the invention.
Figure 4:
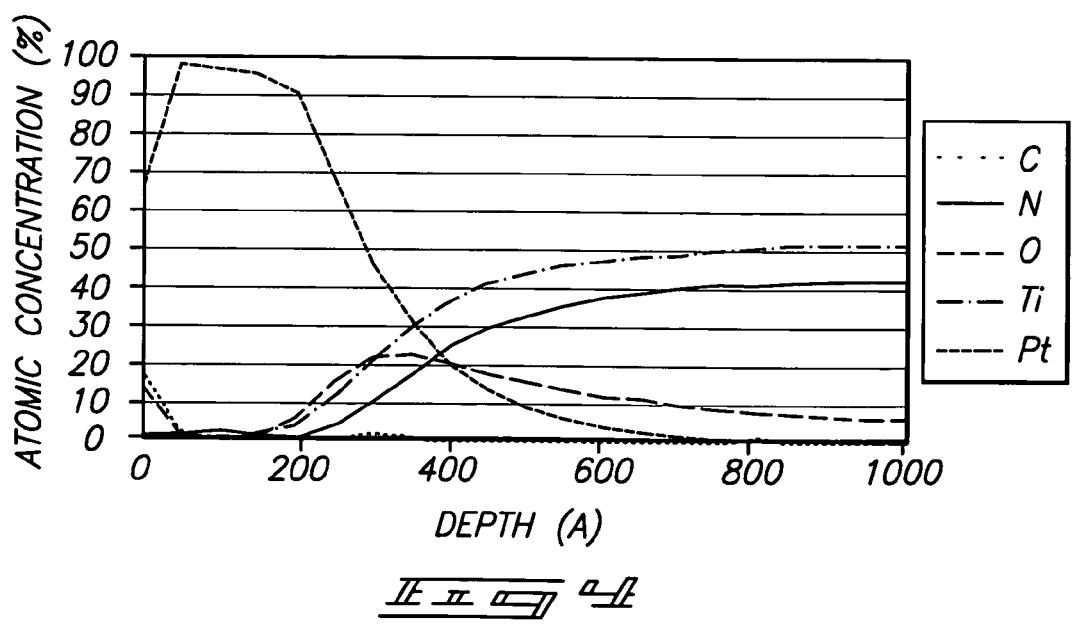
FIG. 4 shows an atomic concentration depth profile of the platinum layer in FIG. 3 after rapid thermal oxidation annealing.

Turning to the Figures, FIG. 2 shows the conformal nature of a platinum layer atomic layer deposited on BPSG and FIG. 3-6 provide an oxygen diffusion comparison. FIG. 3 shows an atomic concentration depth profile obtained by X-ray Photoelectron Spectroscopy (XPS) of an approximately 250 Angstrom thick platinum layer formed on a titanium nitride layer. Notably, the bulk of the platinum layer is free of carbon and oxygen to within detection limits and some carbon and oxygen is shown on the platinum layer surface at 0 Angstroms. Also, the oxygen content within the TiN layer around the platinum interface is about 15 atomic percent. FIG. 4 shows an atomic concentration depth profile obtained by XPS for the platinum layer of FIG. 3 after a 650° C. rapid thermal oxidation anneal. The bulk of the platinum layer is carbon and oxygen free to within detection limits and the surface oxygen is comparably reduced. Oxygen content in the TiN layer around the platinum interface increased to about 22 atomic percent, but the platinum layer and the titanium nitride layer are otherwise unaffected by the oxidation anneal. Accordingly, FIG. 4 demonstrates the oxygen diffusion inhibition properties of the platinum layer.

Forming the platinum layer of FIGS. 3 and 4 was performed while maintaining a titanium nitride surface temperature of 100° C. and beginning with a 5 second exposure to MeCpPt(Me)$_3$ vapor followed by a 5 second, 50 SCCM helium purge. Oxidation was performed with a 50 SCCM flow of ozone for 5 seconds and then followed by a 5 second, 50 SCCM helium purge. The cycles were repeated to form the 250 Angstrom platinum layer.

Figure 5:
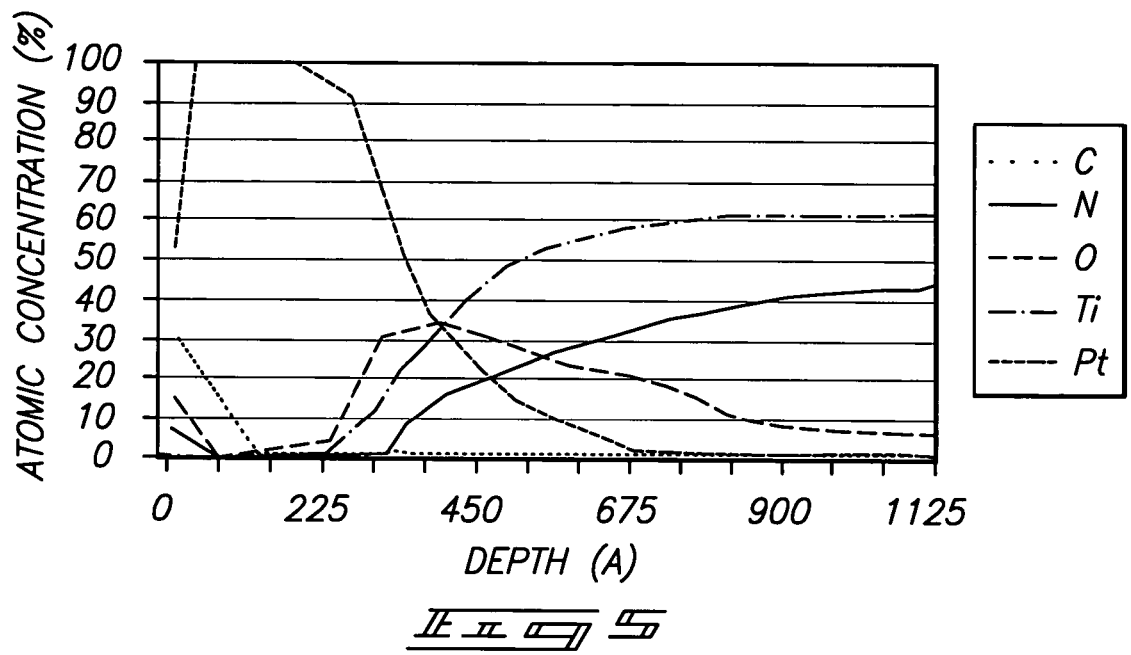
FIG. 5 shows an atomic concentration depth profile of a platinum layer formed on a titanium nitride layer by a method according to another aspect of the invention.
Figure 6:
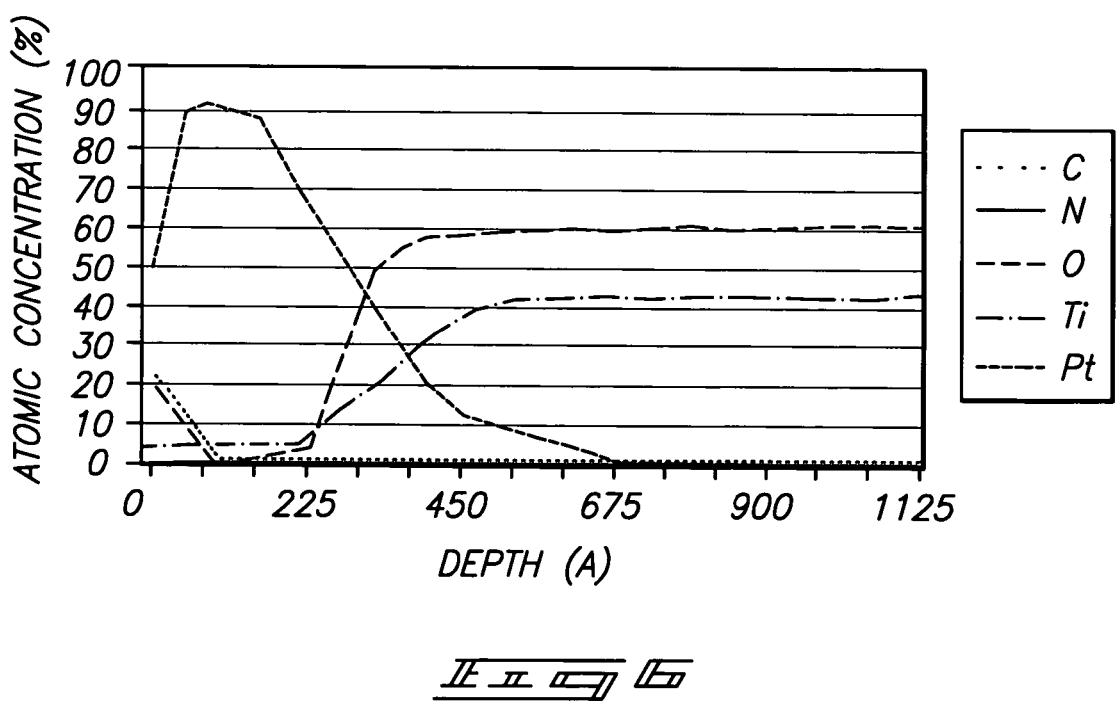
FIG. 6 shows an atomic concentration depth profile of the platinum layer in FIG. 5 after rapid thermal oxidation annealing.

FIG. 5 shows an atomic concentration depth profile obtained by XPS of an approximately 370 Angstrom platinum layer on a titanium nitride layer. Some surface carbon and oxygen and interfacial oxygen are noted. FIG. 6 shows an atomic concentration depth profile of the FIG. 5 platinum layer after a 650° C. rapid thermal oxidation anneal. Notably, oxygen content in the platinum layer increased slightly and the former titanium nitride layer is shown completely oxidized. The platinum layer thus deposited is shown to be ineffective at inhibiting oxygen diffusion.

Forming the platinum layer of FIGS. 5 and 6 was performed while maintaining a titanium nitride surface temperature of 190° C. and beginning with a 5 second exposure to MeCpPt(Me)$_3$ vapor followed by a 5 second, 50 SCCM helium purge. Oxidation was performed with a 50 SCCM flow of oxygen for 5 seconds and then followed by a 5 second, 50 SCCM helium purge. The cycles were repeated to form the 370 Angstrom platinum layer. Although the platinum layer was of suitable quality, the property of inhibiting oxygen diffusion was reduced either by the temperature increase, the change in oxidant, or some combination of the two.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A capacitor electrode forming method comprising:
   chemisorbing a layer of at least one metal precursor at least one monolayer thick on a substrate, the layer comprising non-metal components from the precursor;
   treating the chemisorbed layer at a temperature of between 100 and 190° C. with an oxidant effective to remove the non-metal components to form a treated layer consisting essentially of metal;
   sufficiently repeating the chemisorbing, the treating, and the removing to form at least one additional treated layer consisting essentially of metal on the treated layer; and
   forming a capacitor electrode consisting of the treated layers.

2. The method of claim 1 wherein the non-metal components comprise organic components.

3. The method of claim 1 wherein the oxidant comprises $O_3$.

4. The method of claim 1 wherein treating the layer does not substantially oxidize the metal.

5. The method of claim 1 wherein both the chemisorbing and the treating are performed at a temperature between 100 and 190° C.

6. The method of claim 1 wherein the treated layers exhibit the property of inhibiting oxygen diffusion to a greater extent than would another layer of same composition and thickness formed without the chemisorbing.

7. The method of claim 1 wherein the capacitor electrode consists of a bottom electrode and the substrate comprises insulative material.

8. The method of claim 1 wherein the treating occurs after purging excess metal precursor that is not chemisorbed and without mixing the metal precursor and the oxidant.

9. A capacitor electrode forming method comprising:
   chemisorbing a layer of at least one metal precursor at least one monolayer thick on a substrate, the layer comprising non-metal components from the precursor;
   treating the chemisorbed layer at a temperature of between 100 and 190° C. with an oxidant effective to remove the non-metal components to form a treated layer consisting essentially of metal, the oxidant including $O_3$ and the treating not substantially oxidizing the metal;
   sufficiently repeating the chemisorbing, the treating, and the removing to form at least one additional treated layer consisting essentially of metal on the treated layer; and
   forming a capacitor electrode consisting of the treated layers.

10. The method of claim 9 wherein the non-metal components comprise organic components.

11. The method of claim 9 wherein both the chemisorbing and the treating are performed at a temperature between 100 and 190° C.

12. The method of claim 9 wherein the treated layers exhibit the property of inhibiting oxygen diffusion to a greater extent than would another layer of same composition and thickness formed without the chemisorbing.

13. The method of claim 9 wherein the capacitor electrode consists of a bottom electrode and the substrate comprises insulative material.

14. The method of claim 9 wherein the treating occurs after purging excess metal precursor that is not chemisorbed and without mixing the metal precursor and the oxidant.

15. A capacitor electrode forming method comprising:
   chemisorbing a layer of at least one metal precursor at least one monolayer thick on a substrate, the layer comprising non-metal components from the precursor and the substrate comprising insulative material;
   treating the chemisorbed layer at a temperature of between 100 and 190° C. with an oxidant effective to remove the non-metal components to form a treated layer consisting essentially of metal;
   sufficiently repeating the chemisorbing, the treating, and the removing to form at least one additional treated layer consisting essentially of metal on the treated layer; and
   forming a bottom capacitor electrode consisting of the treated layers, the treated layers exhibiting the property of inhibiting oxygen diffusion to a greater extent than would another layer of same composition and thickness formed without the chemisorbing.

16. The method of claim 15 wherein the non-metal components comprise organic components.

17. The method of claim 15 wherein the oxidant comprises $O_3$.

18. The method of claim 15 wherein treating the layer does not substantially oxidize the metal.

19. The method of claim 15 wherein both the chemisorbing and the treating are performed at a temperature between 100 and 190° C.

20. The method of claim 15 wherein the treating occurs after purging excess metal precursor that is not chemisorbed and without mixing the metal precursor and the oxidant.

* * * * *